United States Patent
Zhang et al.

(10) Patent No.: US 10,205,049 B2
(45) Date of Patent: Feb. 12, 2019

(54) MANUFACTURING METHOD FOR LIGHT BARRIER SUBSTRATE

(71) Applicants: BOE Technology Group Co., Ltd., Beijing (CN); Beijing BOE Display Technology Co., Ltd., Beijing (CN)

(72) Inventors: Xiaoxiang Zhang, Beijing (CN); Zheng Liu, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 165 days.

(21) Appl. No.: 14/436,141

(22) PCT Filed: Jul. 29, 2014

(86) PCT No.: PCT/CN2014/083214
§ 371 (c)(1),
(2) Date: Apr. 16, 2015

(87) PCT Pub. No.: WO2015/131477
PCT Pub. Date: Sep. 11, 2015

(65) Prior Publication Data
US 2016/0372629 A1    Dec. 22, 2016

(30) Foreign Application Priority Data
Mar. 6, 2014    (CN) .......................... 2014 1 0081024

(51) Int. Cl.
*H01L 27/12*    (2006.01)
*H01L 27/32*    (2006.01)
(Continued)

(52) U.S. Cl.
CPC .......... *H01L 33/0095* (2013.01); *G02B 5/003* (2013.01); *G02B 27/2214* (2013.01);
(Continued)

(58) Field of Classification Search
CPC ..... H01L 33/0095; H01L 33/42; H01L 33/44; H01L 33/58; H01L 2933/0016;
(Continued)

(56) References Cited

U.S. PATENT DOCUMENTS 6,117,766 A * 9/2000 Yoon ................. H01L 21/31053
257/E21.244
6,835,645 B2 * 12/2004 Ikura ................. H01L 21/76802
257/E21.577

(Continued)

FOREIGN PATENT DOCUMENTS

CN    1834790 A    9/2006
CN    101159276 A    4/2008
(Continued)

OTHER PUBLICATIONS

Second Office Action, including Search Report, for Chinese Patent Application No. 201410081024.4, dated Sep. 12, 2016, 14 pages.
(Continued)

*Primary Examiner* — Matthew L Reames
*Assistant Examiner* — Scott E Bauman
(74) *Attorney, Agent, or Firm* — Westman, Champlin & Koehler, P.A.

(57) ABSTRACT

The present invention provides a manufacturing method for a light barrier substrate which comprising steps of: forming a metal electrode pattern on a substrate through a first patterning process; forming an insulating layer above the substrate and the metal electrode pattern; forming a metal electrode via hole on the insulating layer and forming a channel pattern for a connecting line between a metal
(Continued)

(a)

(b)

electrode and an exterior integrated circuit (IC) on the insulating layer, with a half tone make process, through a second patterning process; forming a transparent electrode layer pattern on the substrate on which the metal electrode via hole and the channel pattern are formed. The masking steps for forming the insulating layer and the transparent electrode layer may be decreased due to the half tone masking process, thus, the manufacturing process is simplified and the manufacturing efficiency is increased, and the cost for manufacturing the light barrier substrate is lowered because the mask is less used in the manufacturing process.

12 Claims, 3 Drawing Sheets

(51) Int. Cl.
    *H01L 21/768*     (2006.01)
    *H01L 33/00*     (2010.01)
    *H01L 33/42*     (2010.01)
    *H01L 33/44*     (2010.01)
    *H01L 33/58*     (2010.01)
    *G02B 27/22*     (2018.01)
    *G02B 5/00*     (2006.01)

(52) U.S. Cl.
    CPC .... *H01L 21/7684* (2013.01); *H01L 21/76807* (2013.01); *H01L 27/124* (2013.01); *H01L 27/1288* (2013.01); *H01L 27/3248* (2013.01); *H01L 33/42* (2013.01); *H01L 33/44* (2013.01); *H01L 33/58* (2013.01); *H01L 2933/0016* (2013.01); *H01L 2933/0025* (2013.01); *H01L 2933/0058* (2013.01)

(58) Field of Classification Search
    CPC ..... H01L 2933/0025; H01L 2933/0058; H01L 27/1288; H01L 27/124; H01L 2224/03616; H01L 2224/11616; H01L 2224/27616; H01L 21/7684; H01L 21/76807; H01L 27/3248; G02B 27/2214; G02B 5/003
    USPC .............................. 438/29, 637; 257/59, 741
    See application file for complete search history.

(56) References Cited

U.S. PATENT DOCUMENTS

| | | | | |
|---|---|---|---|---|
| 7,402,883 | B2* | 7/2008 | Yang | H01L 21/76865 |
| | | | | 257/499 |
| 7,612,834 | B2 | 11/2009 | Tanimoto et al. | |
| 8,486,740 | B1* | 7/2013 | Jia | G02F 1/133555 |
| | | | | 438/29 |
| 8,611,199 | B2 | 12/2013 | Hayashi et al. | |
| 9,116,383 | B2 | 8/2015 | Liu et al. | |
| 9,465,264 | B2 | 10/2016 | Choi et al. | |
| 2004/0125327 | A1* | 7/2004 | Choi | G02F 1/13458 |
| | | | | 349/187 |
| 2006/0145161 | A1* | 7/2006 | Lee | G02F 1/13458 |
| | | | | 257/72 |
| 2007/0194450 | A1* | 8/2007 | Tyberg | H01L 23/5226 |
| | | | | 257/751 |
| 2010/0127253 | A1* | 5/2010 | Inoue | G02F 1/136286 |
| | | | | 257/43 |
| 2012/0289006 | A1 | 11/2012 | Yuan | |
| 2012/0314143 | A1 | 12/2012 | Shin et al. | |
| 2013/0001565 | A1* | 1/2013 | Jung | H01L 29/42384 |
| | | | | 257/59 |

FOREIGN PATENT DOCUMENTS

| | | |
|---|---|---|
| CN | 101228568 A | 7/2008 |
| CN | 102651337 A | 8/2012 |
| CN | 103151359 A | 6/2013 |
| CN | 103226286 A | 7/2013 |
| CN | 103885281 A | 6/2014 |
| EP | 0 847 208 B1 | 5/2006 |
| JP | 2011-164628 A | 8/2011 |
| KR | 10-2008-0049208 A | 6/2008 |
| KR | 10-2012-0017664 A | 2/2012 |

OTHER PUBLICATIONS

English translation of Box No. V of the Written Opinion for the International Searching Authority for International Application No. PCT/CN2014/083214, dated Dec. 23, 2014, 2 pages.
First Office Action, including Search Report, for Chinese Patent Application No. 201410081024.4, dated May 10, 2016, 10 pages.
International Search Report and Written Opinion for PCT Application No. PCT/CN2014/083214, dated Dec. 23, 2014, 11 pages.
Rejection Decision for Chinese Patent Application No. 201410081024.4, dated Dec. 21, 2016, 16 pages.

* cited by examiner (a) (b)

(a) (b)

(a) (b)

(a) (b)

MANUFACTURING METHOD FOR LIGHT BARRIER SUBSTRATE

CROSS-REFERENCE TO RELATED APPLICATION

This Application is a Section 371 National Stage Application of International Application No. PCT/CN2014/083214, filed Jul. 29, 2014, which has not yet published, which claims priority to Chinese Patent Application No. 201410081024.4, filed Mar. 6, 2014, in Chinese, the contents of which are hereby incorporated by reference in their entirety.

BACKGROUND OF THE INVENTION

Field of the Invention

Embodiments of the present invention relate to a parallax barrier technical field, in particular, to a manufacturing method for a light barrier substrate.

Description of the Related Art

A light barrier 3D technology is also referred to as a parallax barrier or barrier grid technology. The principle thereof is similar to a polarized 3D technology. A light barrier 3D device comprises a switching liquid crystal screen, a polarizing film and a liquid crystal layer of polymers, and a sequence of vertical stripes at an angle of about 90° relative to a line of sight are produced with the liquid crystal layer and the polarizing film, a width between adjacent strips is about dozens of microns, the light passing through the stripes forms a vertical thin stripe grating pattern, which is called as "parallax barrier". The light barrier 3D device is mounted on a parallax barrier between a backlight module and a LCD panel. In a stereo display mode, opaque stripes may block the right eye when the images for the left eye are displayed on the liquid crystal screen; similarly, opaque stripes may block the left eye when the images for the right eye are displayed thereon. A viewer will observe a 3D image by separating visible images for the left eye and for the right eye.

The parallax barrier is realized by a light barrier substrate which comprises a glass substrate, a metal layer, an insulating layer and a transparent pixel electrode layer. Currently, the 3D light barrier substrate is generally manufactured through multiple masking processes, in which three different masks are used and three photolithography processes are performed to form patterns of the metal layer, the insulating layer and the transparent pixel electrode layer respectively.

Therefore, the current manufacturing process for the light barrier substrate is complicated and has a low efficiency and high cost.

SUMMARY OF THE INVENTION

To overcome the above and other defects in the prior art, embodiments of the present invention provide a manufacturing method for a light barrier substrate, which will simplify the manufacturing process for the light barrier substrate, reduce manufacturing cost and improve manufacturing efficiency for the light barrier substrate.

According to an aspect of the present invention, a manufacturing method for a light barrier substrate is provided, which comprises steps of:

forming a metal electrode pattern on a substrate through a first patterning process;

forming an insulating layer above the metal electrode pattern and the substrate;

forming a metal electrode via hole in the insulating layer and forming a channel pattern for a connecting line between the metal electrode and an exterior integrated circuit (IC) in the insulating layer through a second patterning process with a half tone mask; and forming a transparent electrode layer pattern on the substrate on which the metal electrode via hole and the channel pattern have been formed.

In the manufacturing method for the light barrier substrate according to embodiments of the present invention, the insulating layer and the transparent electrode layer may be formed through only one masking process by using a half tone mask, thus, the manufacturing process is simplified and the manufacturing efficiency is improved, and the cost for manufacturing the light barrier substrate is reduced because less masks are used in the manufacturing process.

BRIEF DESCRIPTION OF THE DRAWINGS

Other objects and advantages will be obvious in virtue of the following descriptions of the present invention with reference to accompanying figures, which also may aid to a comprehensive understanding of the present invention.

LIST OF REFERENCE NUMERALS

1: substrate; 2': metal layer; 2: metal electrode pattern (metal electrode); 3: insulating layer; 4-1: first photoresist; 4-2: second photoresist; 5: transparent electrode layer; 6: via hole; 7: channel pattern; 9: connecting line; 20: mask; 30: half tone mask; 40: exterior IC.

DETAILED DESCRIPTION OF PREFERRED EMBODIMENTS OF THE INVENTION

Next, specific implementations of the present invention will be further described in detail in combination with drawings and embodiments. The following embodiments are merely used to explain the present invention, but not to limit the scope of the present invention.

In addition, in the following detailed description, in order to facilitate the explanation, a number of specific details are explained to provide a comprehensive understanding to the embodiments disclosed in the present invention. However, it is obvious that one or more embodiments may be implemented without these specific details. In other cases, conventional structures and devices are shown in schematic diagrams to simplify the drawings.

According to a general concept of the present invention, a manufacturing method for a light barrier substrate is provided, which comprising steps of: forming a metal electrode pattern on the substrate through a first patterning process; forming an insulating layer above the substrate and the metal electrode pattern; forming a metal electrode via hole in the insulating layer and forming a channel pattern for a connecting line between the metal electrode and an exterior integrated circuit (IC) in the insulating layer through a second patterning process with a half tone mask; and forming a transparent electrode layer pattern on the substrate on which the metal electrode via hole and channel pattern having been formed.

During implementing the manufacturing method for the light barrier substrate according to the embodiments of the present invention, only two masking processes are adopted, so that the manufacturing process is simplified, the manufacturing efficiency is improved and the manufacturing cost is reduced.

Generally, the manufacturing method for the light barrier substrate according to the embodiment of the present invention comprises steps of:

S1. forming a metal electrode pattern;
S2. forming a metal electrode via hole and a channel pattern for a connecting line between the metal electrode and an exterior integrated circuit (IC); and
S3. forming a transparent electrode layer.

Figure 1:
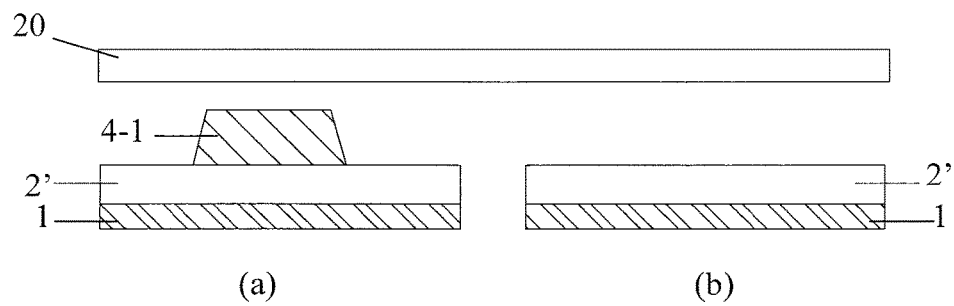
FIGS. 1-8 are plan views of a light barrier substrate manufactured through each step in a manufacturing method for the light barrier substrate according to an exemplary embodiment of the present invention respectively, in which, FIGS.(a) are sectional views showing surroundings of a region in which a metal electrode via hole is formed in the light barrier substrate, FIGS.(b) are sectional views showing surroundings of a region in which a connecting line between a metal electrode of the light barrier substrate and an exterior integrated circuit is located.
Figure 2:
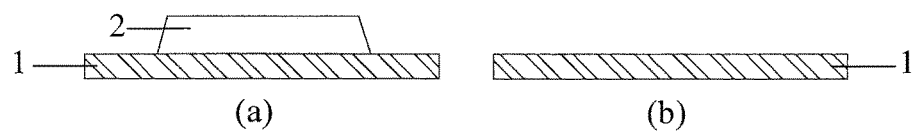

Referring to FIGS. 1 and 2, a step of forming the metal electrode pattern on a substrate 1 through a first patterning process is shown.

In some embodiments, the substrate 1 may be made of a material of glass, plastic or the like, the patterning process includes operations of exposure, ashing, development, etching and the like.

Specifically, firstly, a thin film of a successive metal layer 2' is formed on the substrate 1 and a layer of first photoresist 4-1 is coated on the metal layer 2'; exposure and development processes are performed on the first photoresist 4-1 above the metal layer 2' with a mask 20, so that the photoresist in a region in which a metal electrode pattern will be formed is left and the photoresist in other regions is removed; a first etching process is then performed, the metal layer which is not protected by the photoresist is etched, and the metal layer in a region protected by the photoresist, which forms the metal electrode pattern, is left. At this time, a sectional view of surroundings of a region in which the metal electrode via hole will be formed is shown in FIG.(a) of FIG. 1, a sectional view of surroundings of a region for the connecting line between the metal electrode and the exterior IC is shown in FIG.(b) of FIG. 1.

Finally, the first photoresist above the metal electrode pattern is removed to form the metal electrode pattern (i.e. metal electrode) 2. At this time, a sectional view of surroundings of a region in which the metal electrode via hole will be formed is shown in FIG.(a) of FIG. 2, a sectional view of surroundings of a region for the connecting line between the metal electrode and the exterior IC is shown in FIG.(b) of FIG. 2.

Figure 3:
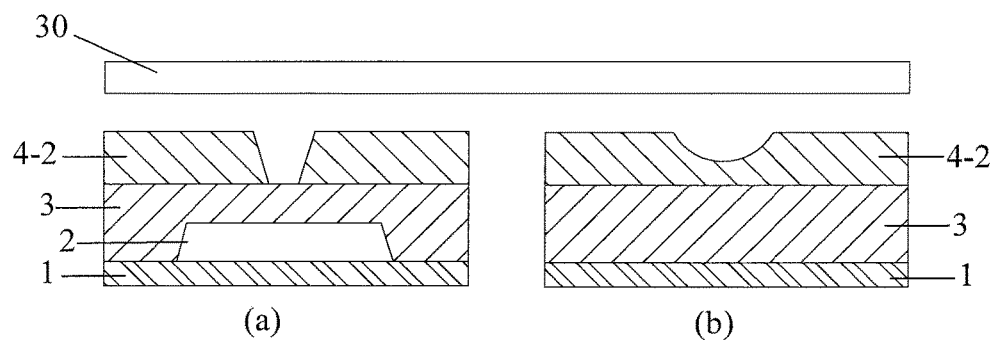
Figure 4:
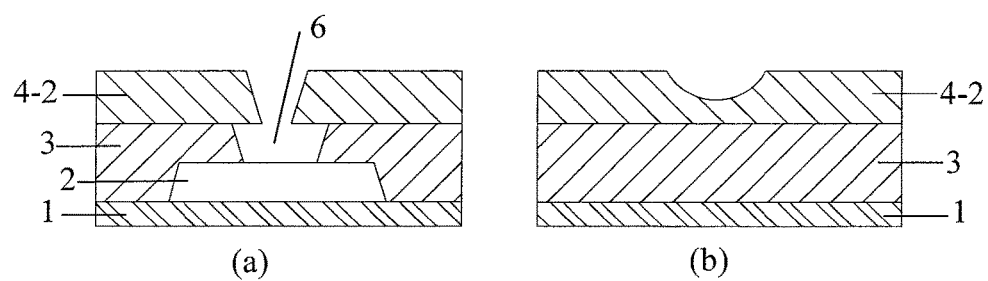

Referring to FIGS. 3 and 4, an insulating layer 3 is formed above the substrate 1 and the metal electrode pattern, and the metal electrode via hole and a channel pattern for a region of a connecting line between the metal electrode and the exterior IC are formed in the insulating layer 3 through a second patterning process.

Figure 10:
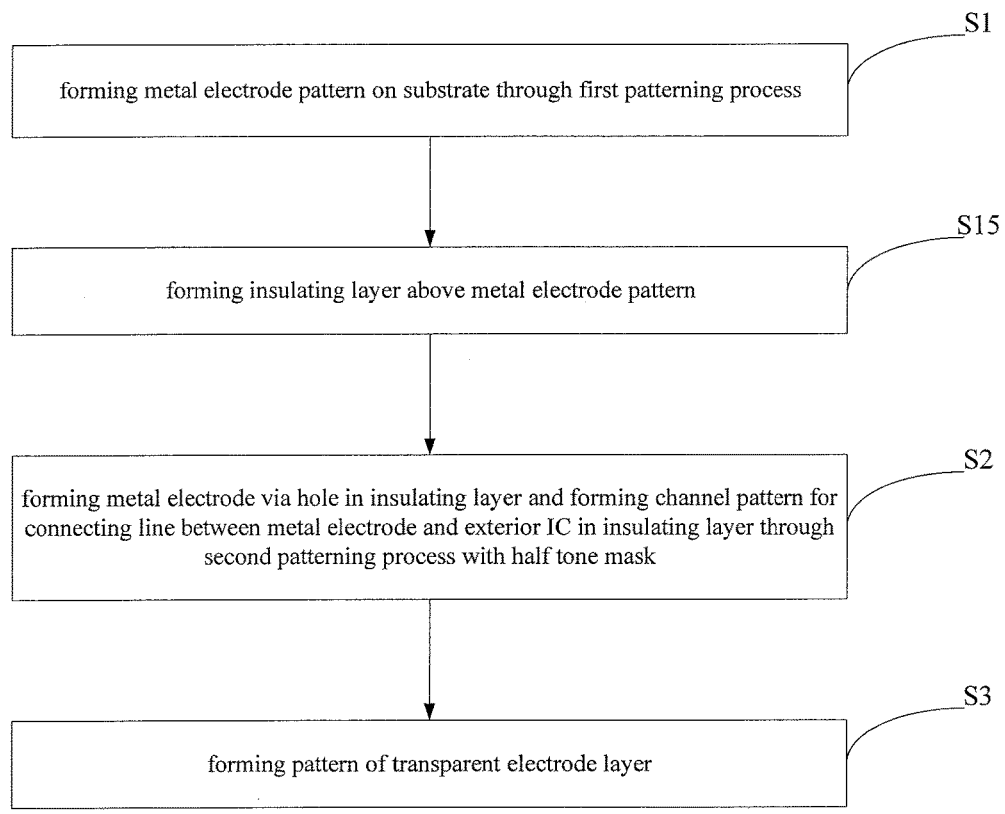
FIG. 10 is a flow chart of the manufacturing method for the light barrier substrate according to an exemplary embodiment of the present invention.

Specifically, firstly, a thin film of an insulating layer 3 is formed above the substrate 1 and the metal electrode pattern formed in the step S1, as indicated by step S15 in FIG. 10, and a layer of second photoresist 4-2 is formed above the insulating layer 3; the second photoresist 4-2 is exposed with a half tone mask 30 which includes an opaque region portion, a semi-transparent region portion and a transparent region portion; after developing the second photoresist 4-2 after the exposure with the half tone mask, the second photoresist 4-2 in a region of the metal electrode via hole is completely removed, the second photoresist 4-2 in a region for the connecting line between the metal electrode and the exterior IC is partially removed, that is, the second photoresist is removed by a certain thickness while the remaining second photoresist of a certain thickness is retained, and the second photoresist in other regions is completely retained. At this time, a sectional view of surroundings of a region in which the metal electrode via hole will be formed is shown in FIG.(a) of FIG. 3, a sectional view of surroundings of a region for the connecting line between the metal electrode and the exterior IC is shown in FIG.(b) of FIG. 3.

The insulating layer in the region in which the second photoresist is completely removed is then etched through a second etching process, and a metal electrode via hole 6 is thus formed. At this time, a sectional view of surroundings of a region in which the metal electrode via hole is formed is shown in FIG.(a) of FIG. 4, a sectional view of surroundings of a region for the connecting line between the metal electrode and the exterior IC is shown in FIG.(b) of FIG. 4.

Figure 5:
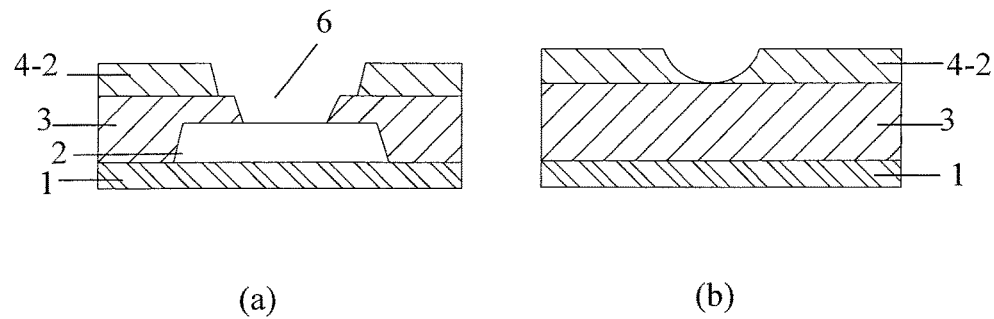
Figure 6:
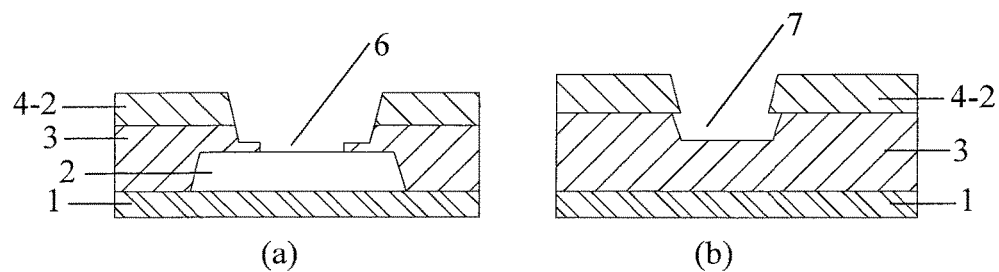

Referring to FIGS. 5 and 6, an ashing process and a third etching process are performed after forming the metal electrode via hole 6, and a channel pattern 7 for the connecting line between the metal electrode and the exterior IC is thus formed in the insulating layer 3.

Specifically, the remaining second photoresist 4-2 with a partial thickness is removed through the ashing process. Because a reaction between the oxygen and the photoresist is utilized to remove the photoresist in the ashing process, the photoresist is removed by a same thickness in all regions. The ashing process is performed to expose the insulating layer in the region for the connecting line between the metal electrode and the exterior IC. During implementing the ashing process, the second photoresist over the insulating layer corresponding to the region for the connecting line between the metal electrode and the exterior IC is removed, while the second photoresist in the region of the via hole and the second photoresist in other regions are removed by a part of thickness. At this time, a sectional view of surroundings of a region in which the metal electrode via hole is formed is shown in FIG.(a) of FIG. 5, a sectional view of surroundings of a region for the connecting line between the metal electrode and the exterior IC is shown in FIG.(b) of FIG. 5.

Next, the insulating layer in the region for the connecting line between the metal electrode and the exterior IC is etched through a third etching process so that a channel pattern 7 is formed, the remaining second photoresist is then removed. After forming the channel pattern 7, a sectional view of surroundings of a region in which the metal electrode via hole is formed is shown in FIG.(a) of FIG. 6, a sectional view of surroundings of a region for the connecting line between the metal electrode and the exterior IC is shown in FIG.(b) of FIG. 6.

Figure 7:
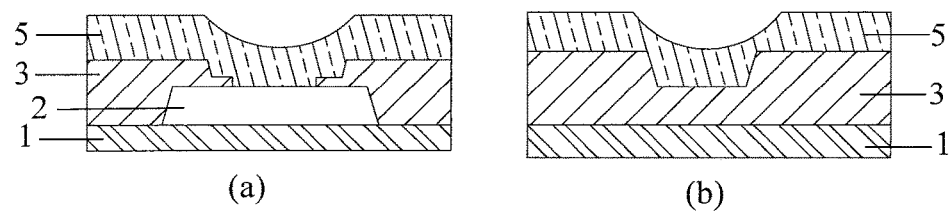
Figure 8:
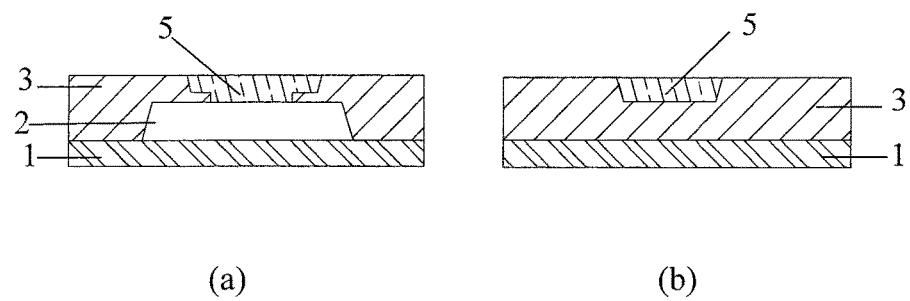

Referring to FIGS. 7 and 8, after the step S2, a transparent electrode layer 5 is formed on the substrate on which the metal electrode via hole and the channel pattern have been formed.

Specifically, the transparent electrode layer 5 is used to form a pixel electrode and may be made of ITO (indium tin oxide) or IZO (indium zinc oxide). At this time, a sectional view of surroundings of a region in which the metal electrode via hole is formed is shown in FIG.(a) of FIG. 7, a sectional view of surroundings of a region for the connecting line between the metal electrode and the exterior IC is shown in FIG.(b) of FIG. 7.

In an exemplary embodiment, after forming the transparent electrode layer 5, a polishing process is performed to make the surface of the light barrier substrate smooth. For example, a chemical mechanical polishing (CMP) is used to remove the transparent electrode layer 5 above the insulating layer in a region in which there is not the via hole and the channel pattern, and to remove a part of the insulating layer and the transparent electrode layer by polishing, in order to decrease the thickness of the light barrier substrate. As a result, a pattern of the transparent electrode layer 5 may be formed, as shown in FIG. 8.

The CMP process is a process for removing a part of an object, which aims to remove a part of an object with a combination of chemical reaction and mechanical polishing. The principle of CMP is that: a wafer is disposed between a carrier and a rotary table with a polishing pad on its surface and dipped in an acidic or alkaline solution containing suspended abrasive, oxidizing agent and activating agent, the wafer moves relative to the polishing pad to be planarized with an interaction of chemical etching and polishing process.

Figure 9:
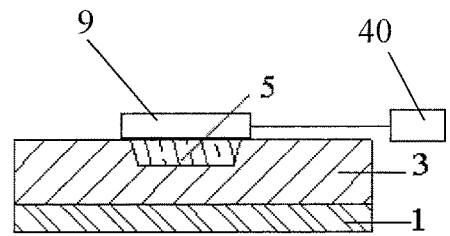
FIG. 9 shows a connection between the light barrier substrate manufactured by the method according to the exemplary embodiment of the present invention and an exterior integrated circuit.

FIG. 9 shows a connection between the light barrier substrate manufactured by the method according to the exemplary embodiment of the present invention and an exterior integrated circuit. As shown in FIG. 9, the metal electrode may be connected to the exterior IC 40 via the connecting line 9.

According to an exemplary embodiment of the manufacturing method for the light barrier substrate of the present invention, the CMP process is employed during manufacturing the semiconductor thin film to peel the thin film, so that the surface thereof is smoother and flatter. The CMP process can be applied in the metallization process in manufacturing the semiconductor to remove an large amount of metal film on the surface in order to form a plug or metal line in the dielectric film. After a wafer is sliced from a single crystal silicon ingot, a flat, polished and flawless wafer surface is prepared through multiple manufacturing steps to meet technological requirements of the integrated circuit. The CMP process is usually used as the final step for manufacturing a wafer to make the wafer planarized and to eliminate completely surface defects caused by slicing the wafer. When the single crystal silicon ingot is sliced into slices, kerfs will be left on both sides of the wafer during the slicing. In order to remove the kerfs, the wafer is placed on a polishing pad and is fixed with wax and a vacuum equipment, then the polishing pad is placed on a polishing machine, and a surface of the wafer is polished into a surface like a mirror to be ready for starting following steps for manufacturing the integrated circuit and assembly.

In the manufacturing method for the light barrier substrate according to various embodiments of the present invention, the half tone mask and ashing process are used, thus, the masking step for forming the insulating layer and the transparent electrode layer is eliminated, the manufacturing process is simplified and the manufacturing efficiency is increased, and less masks are used, so that the manufacturing cost of the light barrier substrate is lowered. The light barrier substrate manufactured by the method of the present invention can be used to connect the metal electrode with the exterior IC, the metal electrode transmits a signal voltage to the transparent conductive electrode through the via hole to control the voltage of the pixel electrode so as to control the conversion of the liquid crystals. Because the pixel electrodes crosses the respective metal lines, the insulating layer is required to insulate the metal layer and the transparent pixel electrode.

The above descriptions are merely preferable implementations of the present invention, it should be noted that those skilled in the art can make several modifications and substitutions thereto without departing from the technical principle of the present invention, and these modifications and substitutions should also be deemed to be within the scope of the present invention.

What is claimed is:

1. A manufacturing method for a light barrier substrate comprising steps of:
   forming a pattern of a metal electrode on a substrate through a first patterning process;
   forming an insulating layer above the pattern of metal electrode;
   forming a metal electrode via hole in the insulating layer and forming a channel pattern for a connecting line between the metal electrode and an exterior integrated circuit (IC) in the insulating layer through a second patterning process with a half tone mask; and
   forming a pattern of a transparent electrode layer with which the channel pattern is filled up completely, the transparent electrode layer received within the channel pattern extending above the insulating layer in a region in which there is not the via hole and the channel pattern,
   the step of forming the pattern of the transparent electrode layer on the substrate on which the metal electrode via hole and the channel pattern have been formed comprises steps of:
   forming the transparent electrode layer above the metal electrode and the insulating layer in which the metal electrode via hole and the channel pattern have been formed; and
   polishing an upper surface of the light barrier substrate into a planar surface and removing the transparent electrode layer above the insulating layer in a region in which there is not the via hole and the channel with a polishing process, so as to form the pattern of the transparent eletrode layer.

2. The manufacturing method for a light barrier substrate according to claim 1, wherein, the step of forming the pattern of the metal electrode on the substrate through the first patterning process comprises steps of:
   forming a successive metal layer on the substrate;
   coating a layer of photoresist on the metal layer;
   performing an exposure and development process on the photoresist above the metal layer with a mask to leave the photoresist in a region where the pattern of the metal electrode is to be formed and remove the photoresist in other regions; and
   etching the metal layer which is not protected by the photoresist by a first etching process and removing the photoresist above the pattern of the metal electrode to form the pattern of the metal electrode.

3. The manufacturing method for a light barrier substrate according to claim 1, wherein,
   the step of forming a metal electrode via hole in the insulating layer and forming a channel pattern for a connecting line between the metal electrode and an exterior integrated circuit (IC) in the insulating layer through a second patterning process with a half tone mask comprises steps of:

forming a layer of photoresist above the insulating layer, and completely removing the photoresist in a region where the metal electrode via hole is to be formed, partially removing the photoresist in a region for a connecting line between the metal electrode and the exterior IC and completely retaining the photoresist in other regions after exposing and developing the photoresist with a half tone mask;

etching the insulating layer in the region in which the photoresist is completely removed by a second etching process, to form the metal electrode via hole;

removing the photoresist by a part of thickness in partial regions by an ashing process after the exposure and development of the photoresist with the half tone mask, so as to expose the insulating layer in the region for the connecting line between the metal electrode and the exterior IC; and etching the insulating layer in the region for the connecting line between the metal electrode and the exterior IC by a third etching process to form the channel pattern and removing the remaining photoresist.

4. The manufacturing method for a light barrier substrate according to claim 3, wherein the half tone mask comprises an opaque region, a semi-transparent region and a transparent region.

5. The manufacturing method for a light barrier substrate according to claim 1, wherein, when removing the transparent electrode layer above the insulating layer with the polishing process, polishing a part of the insulating layer and a part of the transparent electrode layer so as to reduce the thickness of the light barrier substrate.

6. The manufacturing method for a light barrier substrate according to claim 1, wherein the polishing process comprises a chemical mechanical polishing (CMP) process.

7. The manufacturing method for a light barrier substrate according to claim 1, wherein the transparent electrode layer is made of ITO (indium tin oxide) or IZO (indium zinc oxide).

8. The manufacturing method for a light barrier substrate according to claim 2, wherein the transparent electrode layer is made of ITO (indium tin oxide) or IZO (indium zinc oxide).

9. The manufacturing method for a light barrier substrate according to claim 3, wherein the transparent electrode layer is made of ITO (indium tin oxide) or IZO (indium zinc oxide).

10. The manufacturing method for a light barrier substrate according to claim 4, wherein the transparent electrode layer is made of ITO (indium tin oxide) or IZO (indium zinc oxide).

11. The manufacturing method for a light barrier substrate according to claim 5, wherein the transparent electrode layer is made of ITO (indium tin oxide) or IZO (indium zinc oxide).

12. The manufacturing method for a light barrier substrate according to claim 6, wherein the transparent electrode layer is made of ITO (indium tin oxide) or IZO (indium zinc oxide).

* * * * *